United States Patent
Lou

(10) Patent No.: US 6,451,650 B1
(45) Date of Patent: Sep. 17, 2002

(54) LOW THERMAL BUDGET METHOD FOR FORMING MIM CAPACITOR

(75) Inventor: Chine-Gie Lou, Hsinchu (TW)

(73) Assignee: Taiwan Semiconductor Manufacturing Company, Hsin-Chu (TW)

(*) Notice: Subject to any disclaimer, the term of this patent is extended or adjusted under 35 U.S.C. 154(b) by 0 days.

(21) Appl. No.: 09/838,519

(22) Filed: Apr. 20, 2001

(51) Int. Cl.$^7$ .......................................... H01L 21/8242
(52) U.S. Cl. ........................................ 438/253; 438/399
(58) Field of Search ................................ 438/253, 254, 438/255, 396, 398, 399

(56) References Cited

U.S. PATENT DOCUMENTS

| | | | |
|---|---|---|---|
| 5,464,791 A | * 11/1995 | Hirota | |
| 5,650,351 A | 7/1997 | Wu | 437/52 |
| 5,960,280 A | 9/1999 | Jeng et al. | 438/254 |
| 5,966,612 A | 10/1999 | Wu | 438/398 |
| 6,057,205 A | 5/2000 | Wu | 438/398 |
| 6,074,913 A | 6/2000 | Lou et al. | 438/255 |

OTHER PUBLICATIONS

Byoung Taek Lee et al., "Integration of (Ba, Sr)TiO$_3$ Capacitors with Platinum Electrodes Having SiO$_2$ Spacer," IEEE 1997, IEDM 97–249, pp. 10.2.1–10.2.4.

* cited by examiner

Primary Examiner—David Nelms
Assistant Examiner—Phuc T. Dang
(74) Attorney, Agent, or Firm—George O. Saile; Stephen B. Ackerman

(57) ABSTRACT

The next generation of DRAM capacitors will require base electrodes having large effective surface areas and, additionally, will need to be manufactured with the expenditure of minimal energy (low thermal budgets). This is achieved in the present invention by use of a material other than silicon for the base electrode so that silicon HSGs (hemispherical grains) can be used as masks. By using disilane, rather than the more conventional silane, the HSGs can be formed at significantly lower temperatures and their size and mean separation can be well controlled. With the HSGs in place, the base electrode is etched so that its surface area is significantly increased. After removal of the HSGs, a suitable dielectric layer may be laid down, including high K materials such as barium strontium titanate, and the capacitor completed with the deposition of a suitable top electrode.

17 Claims, 2 Drawing Sheets

LOW THERMAL BUDGET METHOD FOR FORMING MIM CAPACITOR

FIELD OF THE INVENTION

The invention relates to the general field of capacitors in integrated circuits with particular reference to devices wherein capacitance is raised through an increase in the base electrode area, as opposed to multi-layering.

BACKGROUND OF THE INVENTION

As the areas of storage electrodes used with DRAMs (dynamic random access memory) continue to decrease in order to match the increase in DRAM density, a large variety of stack structures have been developed by a number of researchers. These include the box, the fin, the crown, the spread, and the cylinder families. However, the capacitance of these stack structures cannot easily satisfy the capacitance requirements of 256M or 1G DRAM units, within their limited design rules.

It is generally agreed that high dielectric constant materials will be needed for use in 1G or 4G DRAMs. Metal insulator metal (MIM) capacitor structures, used in combination with high dielectric constant materials such as $Ta_2O_5$, become the structures of choice for these future DRAM technologies. MIM capacitor structures have the advantage of low interfacial reaction (thereby raising capacitance) but, in the general case, it is very difficult to increase the surface area of a metal electrode.

The prior art relating to ways to increase the surface area of a metal electrode was therefore routinely searched with the following references of interest being found:

U.S. Pat. No. 6,074,913 (Lou et al.) shows a capacitor process that comprises: 1) forming a tungsten bottom electrode which is coated with successive layers of titanium nitride and silicon oxide, 2) forming HSG (hemispherical grains) of silicon, which are used as a mask to etch the silicon oxide and titanium nitride layers converting them into a hard mask 3) after removal of the HSG, anisotropically etching the tungsten layer through said hard mask to form a bottom electrode (having no sidewalls). Lou give very little detail on how they form HSG except to note that CVD (chemical vapor deposition) of polysilicon is normally done using silane.

U.S. Pat. No. 6,057,205 (Wu) teaches a capacitor structure that is similar to that formed by the process of the present invention in that it also has sidewalls, but the total amount of heat energy (thermal budget) that is required to execute the Wu process is significantly higher than that required for the process of the present invention. Unlike the present invention, Wu uses silane to deposit the HSG and uses oxidation, rather than etching, to increase the surface area of the base electrode.

U.S. Pat. No. 5,966,612 (Wu), U.S. Pat. No. 5,650,351 (Wu), and U.S. Pat. No. 5,960,280 (Jenq et al.) all show capacitor formation processes that make use of HSG silicon.

The present invention describes an improved HSG-based process that does not use silane and which requires a significantly lower thermal budget than do processes of the prior art. The latter feature is particularly important because, for advanced DRAMs (over 1 Gb per chip), a metal gate is used instead of the conventional polysilicon gate and the gate oxide is a high K material rather than silicon oxide. The use of a metal gate comes with the constraint that a lower processing temperature is required if high yield and reliability are to be retained. Another important feature of the present invention (which is not present in the prior art) is improved control of the HSG sizes and separations.

SUMMARY OF THE INVENTION

It has been an object of the present invention to provide a process for the manufacture of a capacitor for use as part of a DRAM structure in an integrated circuit.

Another object of the invention has been that said process require the expenditure of a low thermal budget relative to similar processes of the prior art in order to guarantee high yield and reliability.

A further object has been that the process provide improved control over the sizes and separations of the HSGs that are used as masks within the process.

A still further object has been that said HSGs be used as a contact mask rather than for the formation of a hard mask.

Yet another object has been that the base pedestal of the capacitor be isotropically etched using a dry chemical etch rather than anisotropically using a reactive ion etch.

These object have been achieved by using a material other than silicon for the base electrode so that the HSGs can be used directly for masking. By using disilane, rather than the more conventional silane, the HSGs can be formed at significantly lower temperatures and their size and mean separation can be well controlled. With the HSGs in place, the base electrode is etched so that its surface area is significantly increased. After removal of the HSGs, a suitable dielectric layer may be laid down, including high K materials such as barium strontium titanate, and the capacitor completed with the deposition of a suitable top electrode.

DESCRIPTION OF THE PREFERRED EMBODIMENTS

Figure 1:
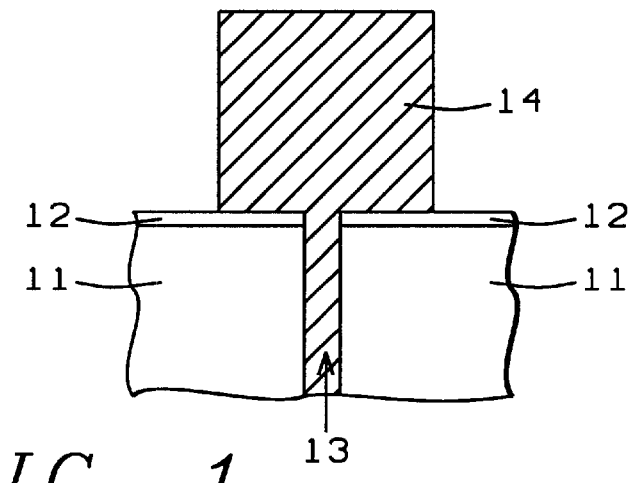
FIG. 1 shows the starting point for the process of the present invention.

Referring now to FIG. 1, the process of the present invention begins with the provision of a suitable substrate. Most commonly this substrate will be a partially formed integrated circuit, shown schematically in FIG. 1 as region 11. Dielectric layer 12 is the top layer for the integrated circuit. Contact hole 13 extends downwards through layers 11 and 12.

The first process step is the deposition of a conductive layer in a sufficient thickness to fill hole 13 and extend above the surface of 12 where, after suitable patterning and etching, it forms pedestal 14. The material used for 14 must not be silicon. We have found two materials to be particularly suitable. These are titanium nitride (first embodiment of the invention) and ruthenium (second embodiment), which we have preferred over other possible choices because reliability concerns. The pedestal has a thickness between about 0.3 and 1.5 microns.

A key feature of the invention (which is common to both embodiments) is the use of disilane gas ($Si_2H_6$), as the source of silicon for the formation the HSGs. This is accomplished by exposing pedestal 14 to disilane at a temperature between about 380 and 425° C. (this being significantly lower than if silane had been used) and at a pressure between about $10^{-3}$ and $10^{-4}$ torr for between about 10 and 400 seconds. The result is the formation of a discontinuous polysilicon seed layer to an effective thickness that is between about 5 and 100 Angstroms on pedestal 14's top surface and sidewalls.

Figure 2:
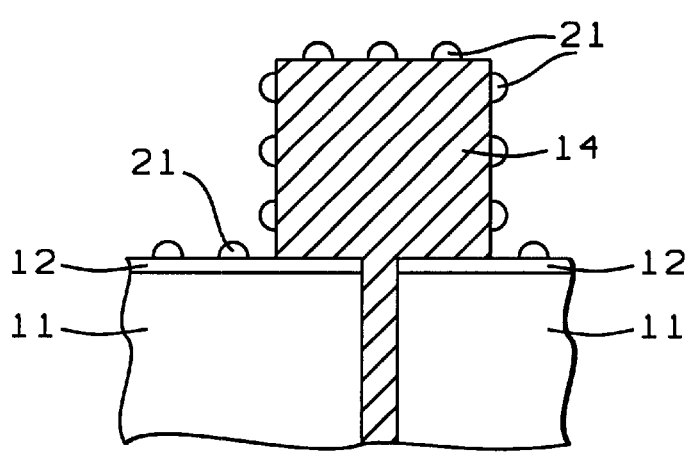
FIG. 2 illustrates the formation of silicon HSGs on the surface of the base pedestal.

Then, the pressure is reduced to less than about $10^{-8}$ torr while the temperature remains at between about 400 and 425° C. This causes the seed layer to anneal and results in a steady growth of the thicker areas at the expense of the thinner ones. By controlling this anneal time (which is typically between about 5 and 25 minutes) good control can be exercised over the mean diameter (generally between about 100 and 600 Angstroms) and average separation distance (generally between about 100 and 2,000 Angstroms) of the miniature silicon hemispheres. When this is done, it is no longer necessary to introduce a short cleanup etch (to ensure full isolation of the grains) as is commonly done in the prior art. The HSGs are schematically shown as areas such as 21 in FIG. 2.

Now follows another key feature of the invention. With the (unmodified) hemispherical silicon grains acting as a mask, pedestal 14 is isotropically etched using a chemical dry etch, as opposed to the reactive ion etching processes that are taught in the prior art. For titanium nitride, our preferred dry etch process has been to use a mix of carbon tetrafluoride and trifluoromethane as the reactive gases, while for ruthenium it has been to use a mix of chlorine and boron trichloride as the reactive gases.

Figure 3:
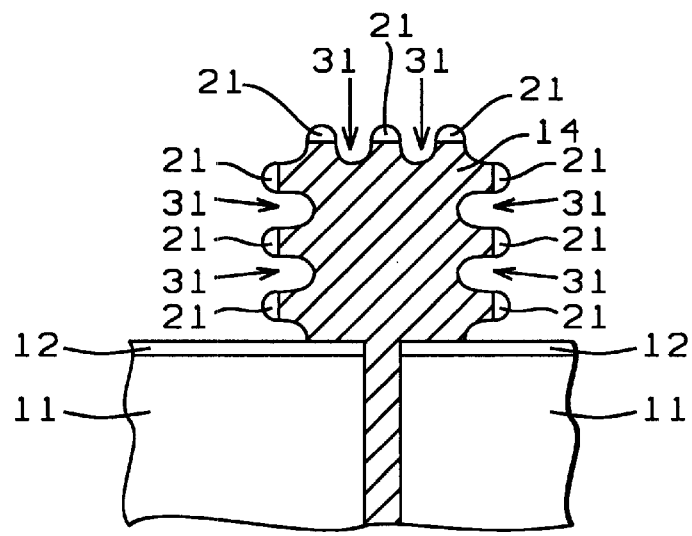
FIG. 3 shows the effects of etching the pedestal with the HSGs acting as a mask.

This results in the etching of numerous grooves (such as 31 in FIG. 3) into the surface of 14, thereby significantly increasing its surface area by an estimated factor of between about 1.5 and 2.5 times.

Figure 4:
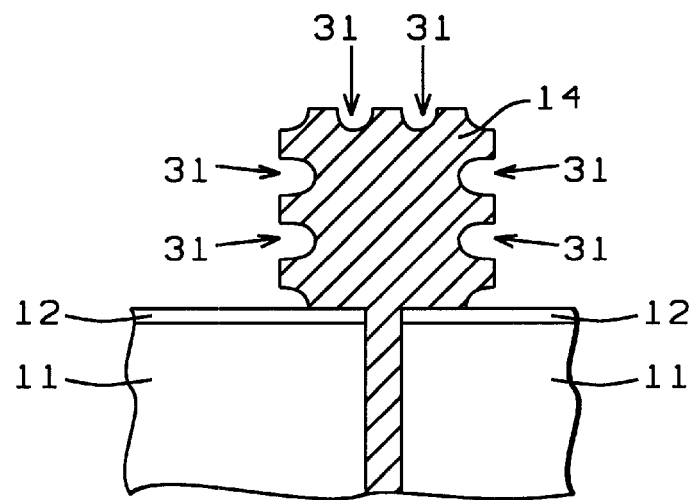
FIG. 4 is FIG. 3 with the HSGs selectively removed.

A second chemical dry etch is then used to selectively remove all of the hemispherical silicon grains 21, giving the structure the appearance shown schematically in FIG. 4. For this step we have used a mix of chlorine and hydrogen bromide as the reactive gases.

Figure 6:
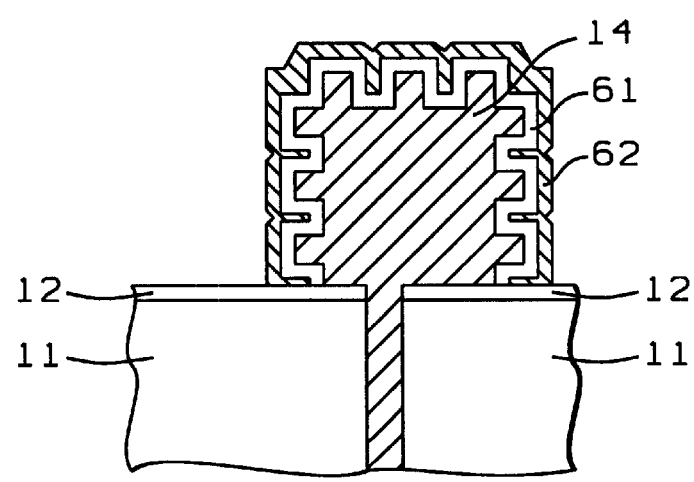
FIG. 6 shows the final structure.

For the first embodiment, formation of the capacitor is completed by depositing a layer of tantalum oxide (such as layer 61 in FIG. 6) onto the titanium nitride pedestal, followed by the deposition of a second layer of titanium nitride (such as layer 62 in FIG. 6).

Figure 5:
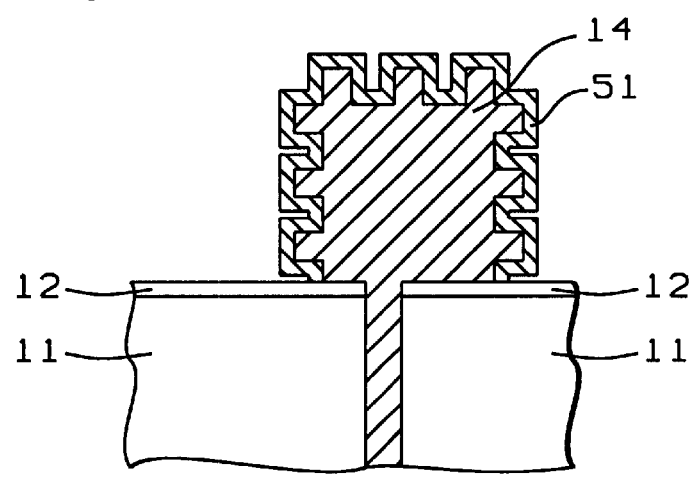
FIG. 5 is FIG. 4 with an added layer of electroless platinum.

For the second embodiment, a layer of platinum (51 in FIG. 5) is first laid down by electroless plating on ruthenium pedestal 14 (to reduce capacitor leakage current). Deposition is to a thickness between about 100 and 800 Angstroms, from an aqueous solution of platinum sulfate and HF at a temperature between about 20 and 80° C. Then, formation of the capacitor is completed by depositing a layer of a high dielectric constant material such as barium strontium titanate (such as layer 61 in FIG. 6) onto the ruthenium pedestal to a thickness between about 50 and 150 Angstroms, followed by the deposition of a second layer of ruthenium (such as layer 62 in FIG. 6).

While the invention has been particularly shown and described with reference to the preferred embodiments thereof, it will be understood by those skilled in the art that various changes in form and details may be made without departing from the spirit and scope of the invention.

What is claimed is:

1. A process for forming a capacitor, comprising:
   providing a substrate and depositing thereon a first layer of a conductive material other than silicon;
   patterning and etching said first layer of conductive material to form a pedestal having a surface area and having sidewalls and a top surface;
   using disilane gas, at a temperature between about 380 and 425° C. and at a pressure between about $10^{-3}$ and $10^{-4}$ torr for a first time period, forming a discontinuous polysilicon seed layer on the top surface and sidewalls;
   then reducing the pressure to less than about $10^{-8}$ torr while leaving the temperature at between about 400 and 425° C. for a second time period, whereby the seed layer grows into hemispherical grains of silicon having a mean diameter between about 100 and 600 Angstroms, spaced an average distance apart of between about 100 and 2,000 Angstroms, said grain size and spacing being dependent on the duration of said second time period;
   using a first chemical dry etch, with said hemispherical silicon grains acting as a mask, isotropically etching the pedestal to increase its surface area;
   using a second chemical dry etch, selectively removing all of said hemispherical silicon grains;
   depositing a dielectric layer onto the titanium nitride pedestal; and
   depositing a second conductive layer onto said dielectric layer, thereby forming the capacitor.

2. The process described in claim 1 wherein the pedestal has a thickness between about 0.3 and 1.5 microns.

3. The process described in claim 1 wherein said first time period is between about 10 and 400 seconds.

4. The process described in claim 1 wherein said second time period is between about 300 and 1,500 seconds.

5. A process for forming a capacitor, comprising:
   providing a partially formed integrated circuit having a topmost dielectric layer through which passes a contact hole that extends downwards to said integrated circuit;
   depositing a first layer of titanium nitride in said hole and on said dielectric layer;
   patterning and etching the titanium nitride layer to form a pedestal having sidewalls and a top surface;
   using disilane gas, at a temperature between about 380 and 425° C. and at a pressure between about $10^{-3}$ and $10^{-4}$ torr for a first time period, forming a discontinuous polysilicon seed layer on the top surface and sidewalls;
   then reducing the pressure to less than about $10^{-8}$ torr while leaving the temperature at between about 400 and 425° C. for a second time period, whereby the seed layer grows into hemispherical grains of silicon having a mean diameter between about 100 and 600 Angstroms, spaced an average distance apart of between about 100 and 2,000 Angstroms, said grain size and spacing being dependent on the duration of said second time period;
   using a first chemical dry etch, with said hemispherical silicon grains acting as a mask, isotropically etching the titanium nitride pedestal;
   using a second chemical dry etch, selectively removing all of said hemispherical silicon grains;
   depositing a layer of tantalum oxide onto the titanium nitride pedestal; and
   depositing a second layer of titanium nitride onto the layer of tantalum oxide, thereby forming the capacitor.

6. The process described in claim 5 wherein the pedestal has a thickness between about 0.3 and 1.5 microns.

7. The process described in claim 5 wherein said first time period is between about 10 and 400 seconds.

8. The process described in claim 5 wherein said second time period is between about 300 and 1,500 seconds.

9. The process described in claim 5 wherein said layer of tantalum oxide is deposited to a thickness between about 50 and 150 Angstroms.

10. The process described in claim 5 wherein said discontinuous seed layer is deposited to an effective thickness that is between about 5 and 100 Angstroms.

11. A process for forming a capacitor at a low thermal budget, comprising:

provided a partially formed integrated circuit having a topmost dielectric layer through which passes a contact hole that extends downwards to said integrated circuit;

depositing a first layer of ruthenium in said hole and on said dielectric layer;

patterning and etching the ruthenium layer to form a pedestal having sidewalls and a top surface;

using disilane gas, at a temperature between about 380 and 425° C. and at a pressure between about $10^{-3}$ and $10^{-4}$ torr for a first time period, forming a discontinuous polysilicon seed layer on the top surface and sidewalls;

then reducing the pressure to less than about $10^{-8}$ torr while leaving the temperature at between about 400 and 425° C. for a second time period, whereby the seed layer grows into hemispherical grains of silicon having a mean diameter between about 100 and 600 Angstroms, spaced an average distance apart of between about 100 and 2,000 Angstroms, said grain size and spacing being dependent on the duration of said second time period;

using a first chemical dry etch, with said hemispherical silicon grains acting as a mask, isotropically etching the ruthenium pedestal;

using a second chemical dry etch, selectively removing all of said hemispherical silicon grains;

depositing a layer of platinum onto the ruthenium pedestal;

depositing a layer of barium strontium titanate onto the ruthenium pedestal; and depositing a second layer of ruthenium onto the layer of barium strontium titanate, thereby forming the capacitor.

12. The process described in claim 11 wherein the pedestal has a thickness between about 0.3 and 1.5 microns.

13. The process described in claim 11 wherein said first time period is between about 10 and 400 seconds.

14. The process described in claim 11 wherein said second time period is between about 300 and 1,500 seconds.

15. The process described in claim 11 wherein the step of depositing a layer of platinum onto the ruthenium pedestal further comprises electrolessly depositing platinum, to a thickness between about 100 and 800 Angstroms, from an aqueous solution of platinum sulfate and hydrofluoric acid at a temperature between about 20 and 80° C.

16. The process described in claim 11 wherein said layer of barium strontium titanate is deposited to a thickness between about 50 and 150 Angstroms.

17. The process described in claim 11 wherein said discontinuous seed layer is deposited to an effective thickness that is between about 5 and 100 Angstroms.

* * * * *